(12) United States Patent
Kaviani et al.

(10) Patent No.: US 9,344,064 B2
(45) Date of Patent: May 17, 2016

(54) INTEGRATED CIRCUIT COMPRISING FREQUENCY CHANGE DETECTION CIRCUITRY

(71) Applicant: Rambus Inc., Sunnyvale, CA (US)

(72) Inventors: Kambiz Kaviani, Palo Alto, CA (US); Kashinath Prabhu, Bangalore (IN); Brian Hing-Kit Tsang, Fremont, CA (US); Jared L. Zerbe, Woodside, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

(21) Appl. No.: 14/808,936

(22) Filed: Jul. 24, 2015

(65) Prior Publication Data

US 2015/0333740 A1    Nov. 19, 2015

Related U.S. Application Data

(63) Continuation of application No. 13/839,059, filed on Mar. 15, 2013, now Pat. No. 9,136,826.

(60) Provisional application No. 61/697,924, filed on Sep. 7, 2012.

(51) Int. Cl.
| | |
|---|---|
| *G01R 23/02* | (2006.01) |
| *H03K 3/012* | (2006.01) |
| *H03K 5/26* | (2006.01) |
| *G11C 7/22* | (2006.01) |
| *H03L 7/24* | (2006.01) |

(52) U.S. Cl.
CPC .............. *H03K 3/012* (2013.01); *G01R 23/02* (2013.01); *G11C 7/222* (2013.01); *H03K 5/26* (2013.01); *H03L 7/24* (2013.01)

(58) Field of Classification Search
CPC ............ H03K 3/012; H03K 5/26; H03L 7/24; G01R 23/02; G01R 23/10; G11C 7/22; G11C 7/222
USPC ....................................................... 327/39–49
See application file for complete search history.

(56) References Cited

U.S. PATENT DOCUMENTS

| | | |
|---|---|---|
| 7,664,213 B2 | 2/2010 | Hassan |
| 7,786,763 B1 | 8/2010 | Bal et al. |

(Continued)

OTHER PUBLICATIONS

Balamurugan et al., "A Scalable 5-15 Gdbs, 14-75 mW Low-Power I/O Transceiver in 65 nm CMOS," IEEE Journal of Solid-State Circuits, vol. 43, No. 4, Apr. 2008.

(Continued)

*Primary Examiner* — Patrick O'Neill
(74) *Attorney, Agent, or Firm* — Park, Vaughan, Fleming & Dowler LLP; Laxman Sahasrabuddhe

(57) ABSTRACT

Embodiments of an integrated circuit (IC) comprising frequency change detection circuitry are described. Some embodiments include first circuitry to generate a second clock signal based on a first clock signal, wherein the first clock signal has a first clock frequency, and wherein the second clock signal has a second clock frequency that is an integral multiple of the first clock frequency. The embodiments further include second circuitry to obtain samples by oversampling the first clock signal using the second clock signal. Additionally, the embodiments include third circuitry to detect a change in the first clock frequency based on the samples.

15 Claims, 9 Drawing Sheets

(56) References Cited

U.S. PATENT DOCUMENTS 9,136,826 B2 * 9/2015 Kaviani ............... H03K 3/012
2011/0140789 A1 6/2011 Kumar

OTHER PUBLICATIONS

Kratyuk et al., "Frequency Detector for Fast Frequency Lock of Digital PLLs," Electronic Letters, vol. 43, No. 1, pp. 13-14, Jan. 4, 2007.

Leibowitz et al., "A 4.3 GB/s Mobile Memory Interface with Power-Efficient Bandwidth Scaling," IEEE Journal of Solidstate Circuits, Apr. 2010, pp. 889-898, vol. 45, No. 4.

Poulton et al., "A 14-mW 6.25-Gb/s Transceiver in 90-nm CMOS," IEEE Journal of Solid-State Circuits, Dec. 2007, pp. 2745-2757, vol. 42, No. 12.

Zerbe et al.,"A 5.6 Gb/s 2.4mW/Gb/s Bidirectional Link with 8ns Power-On," VLSI Symposium in Kyoto, Japan, Jun. 15, 2011.

* cited by examiner

INTEGRATED CIRCUIT COMPRISING FREQUENCY CHANGE DETECTION CIRCUITRY

RELATED APPLICATION

This application is a continuation of, and claims priority to, U.S. application Ser. No. 13/839,059, having the same title and inventors, filed on 15 Mar. 2013. U.S. application Ser. No. 13/839,059 is a non-provisional of, and claims priority to, U.S. Provisional Application No. 61/697,924, entitled "Fast frequency change detection for low power multi-rate systems," by the same inventors, filed 7 Sep. 2012 (Attorney Docket No. R-RA1364.Prov1.US), the contents of which are herein incorporated by reference in their entirety.

BACKGROUND

This disclosure generally relates to electronic circuits. The throughput and bandwidth demands on a memory system can vary rapidly in response to the use of different applications. To reduce power consumption, it is desirable to operate a memory interface at the lowest clock frequency possible while delivering adequate performance.

Some memory system designs change the clock frequency of the memory interface based on the changing throughput and bandwidth demands on the memory system. However, these designs suffer from a performance hit because of the long latency required to change the memory interface's clock frequency.

DETAILED DESCRIPTION

Embodiments described herein feature an integrated circuit (IC) that is capable of detecting a change in a clock frequency very quickly. Specifically, in some embodiments, the IC receives a first clock signal that has a first clock frequency. In these embodiments, the IC includes first circuitry to generate a second clock signal based on the first clock signal, wherein the second clock signal has a second clock frequency that is an integral multiple of the first clock frequency. The first circuitry is capable of maintaining a lock on the first clock signal and keeping the frequency of the second clock signal substantially constant even when the frequency of the first clock signal changes to a sub- or super-harmonic frequency. The IC also includes second circuitry to obtain samples by oversampling the first clock signal using the second clock signal. The IC additionally includes third circuitry to detect a change in the first clock frequency based on the samples.

Once a change in a clock frequency is detected, this information can be used in a number of applications. In one application, the detected change in the clock frequency can be used to implement a frequency agile memory system. In another application, a path in a clock distribution system can be selected from a plurality of paths in the clock distribution systems based on the detected change in the clock frequency. Selecting a frequency dependent path in the clock distribution system can reduce the overall power consumed by the clock distribution system. In yet another application, the power consumption of a memory interface can be reduced and/or the signal integrity of the memory interface can be improved by changing the termination impedance based on the detected change in the clock frequency. The following discussion describes some embodiments for detecting a change in a clock frequency, and describes some applications in which the embodiments can be used.

Figure 1:
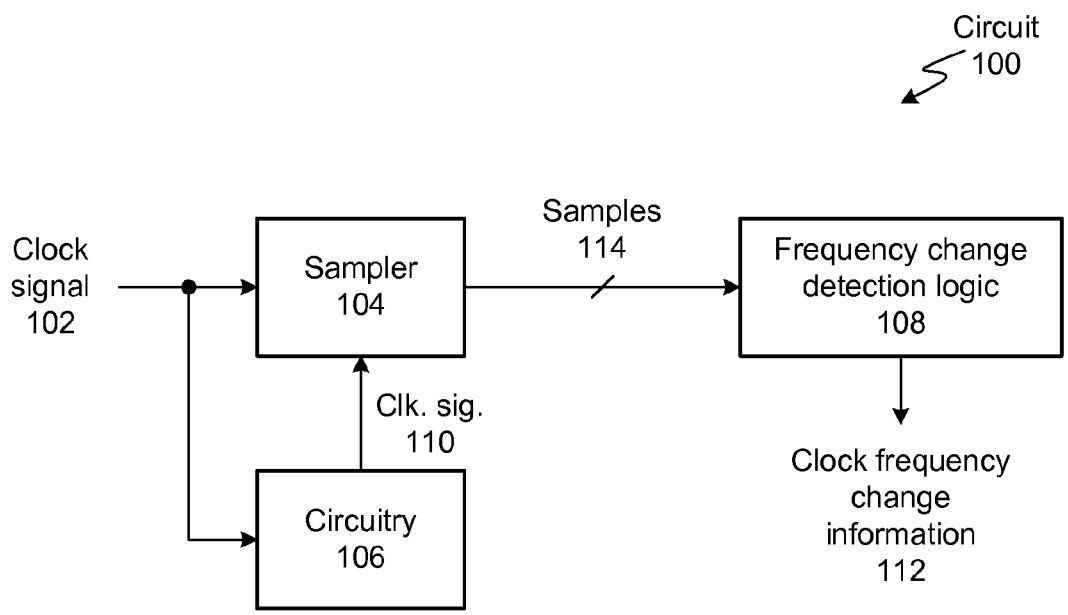
FIG. 1 illustrates circuitry that can detect a change in a clock frequency in accordance with some embodiments described herein.

FIG. 1 illustrates circuitry that can detect a change in a clock frequency in accordance with some embodiments described herein. Circuit 100 includes circuitry 106, sampler 104, and frequency change detection logic 108. Clock signal 102 is provided as an input to circuitry 106. Circuitry 106 outputs clock signal 110 whose clock frequency is an integral multiple (e.g., 16×) of the clock frequency of clock signal 102. In some embodiments, circuitry 106 automatically changes the clock multiplication ratio based on the clock frequency of clock signal 102 so as that the clock frequency of clock signal 110 is substantially constant. For example, if the clock frequency of clock signal 102 is halved, circuitry 106 is capable of automatically doubling the clock multiplication ratio.

Specifically, circuitry 106 can include a multiplying injection-locked oscillator (MILO) whose natural oscillation frequency is close to an integral multiple of clock signal 102. Clock signal 102 is provided as an injection signal to the MILO, and the MILO outputs a clock signal whose frequency is close to the MILO's natural oscillation frequency. When clock signal 102 changes to a different sub-harmonic of the MILO's natural oscillation frequency, the clock multiplication ratio of the MILO automatically changes because the MILO continues to output a clock signal at the MILO's natural oscillation frequency.

Sampler 104 samples clock frequency 102 using clock signal 110 to generate samples 114, which can then be provided as input to frequency change detection logic 108. Frequency change detection logic 108 detects a change in clock frequency of clock signal 102 based on samples 114 and outputs clock frequency change information 112. Clock frequency change information 112 can then be used in a number of applications, some of which are described below in reference to FIGS. 5A, 5B, 5C, 6-8.

Figure 2A:
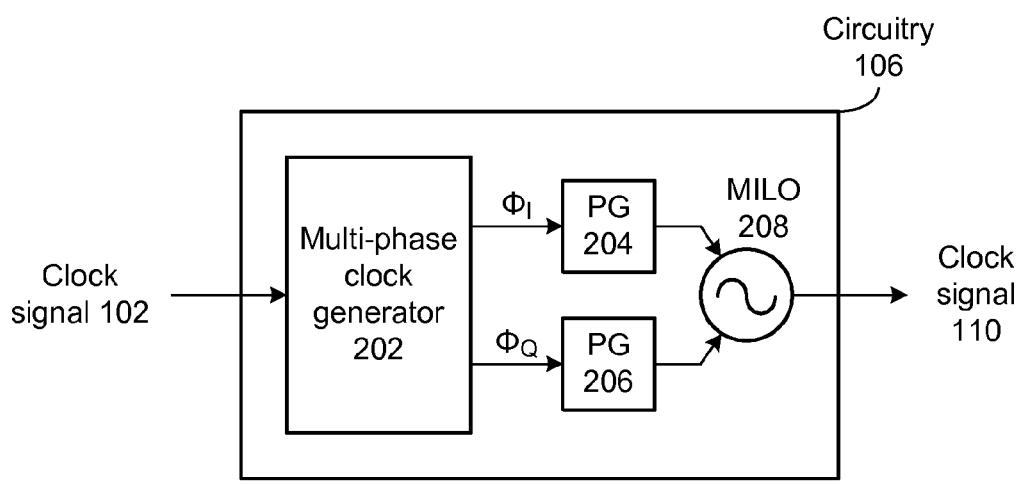
FIG. 2A illustrates an implementation of circuitry 106 in accordance with some embodiments described herein.

FIG. 2A illustrates an implementation of circuitry 106 in accordance with some embodiments described herein. Circuitry 106 includes multi-phase clock generator 202, pulse generators 204 and 206, and MILO 208. Multi-phase clock generator 202 generates two or more clock signals having different phases based on clock signal 102. Each of these clock signals can be inputted into a pulse generator, and the outputs of the pulse generators can be injected into MILO 208.

In FIG. 2A, multi-phase clock generator 202 generates two clock signals, namely, an in-phase clock signal $\Phi_I$ and a quadrature phase clock signal $\Phi_Q$. In other embodiments, multi-phase clock generator 202 can generate more than two clock signals having different phases. In-phase clock signal $\Phi_I$ is provided as an input to pulse generator 204, and quadrature-phase clock signal $\Phi_Q$ is provided as an input to pulse generator 206. The outputs from pulse generators 204 and 206 are then injected into one or more injection locations in MILO 208.

In some embodiments, multi-phase clock generator 202 can include an ILO or a MILO that locks onto clock signal 102. An ILO (or a MILO) includes multiple delay elements that are arranged in a loop. A delay element in the loop of an ILO (or a MILO) may or may not invert its input signal. However, to form an oscillatory loop, an effective inversion of the signal is required. The outputs of the multiple delay elements of an ILO (or a MILO) can be used as a set of clock signals having different phases. The pulse combining circuitry (i.e., a multi-phase clock generator followed by two or more pulse generators whose outputs are injected into a MILO) shown in FIG. 2A can increase the lock range of circuitry 106 and reduce the jitter in clock signal 110.

Figure 2B:
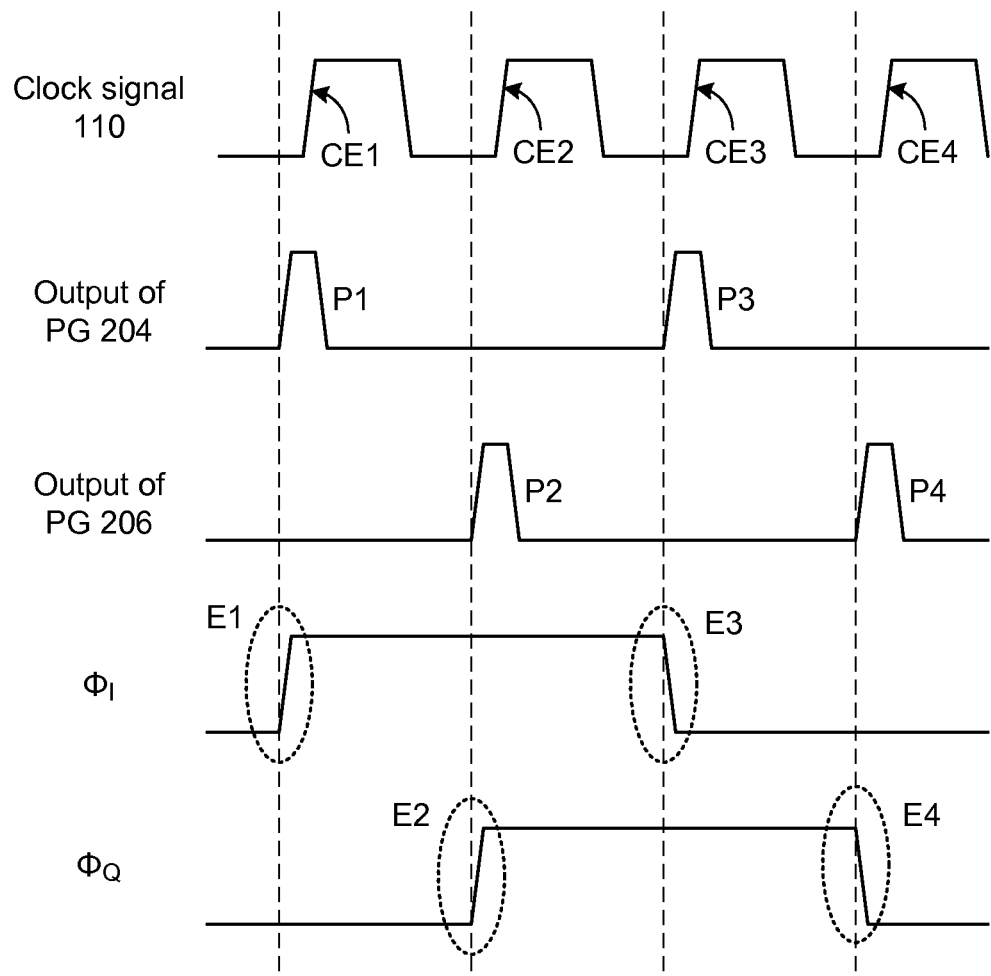
FIG. 2B illustrates waveforms that correspond to the circuitry shown in FIG. 2A in accordance with some embodiments described herein.

FIG. 2B illustrates waveforms that correspond to the circuitry shown in FIG. 2A in accordance with some embodiments described herein. Edge E1 in in-phase clock signal $\Phi_I$ corresponds to pulse P1 in the output of pulse generator 204, edge E2 in quadrature-phase clock signal $\Phi_Q$ corresponds to pulse P2 in the output of pulse generator 206, edge E3 in in-phase clock signal $\Phi_I$ corresponds to pulse P3 in the output of pulse generator 204, and edge E4 in quadrature-phase clock signal $\Phi_Q$ corresponds to pulse P4 in the output of pulse generator 206. Pulses P1, P2, P3, and P4 are injected into MILO 208 and correspond with clock edges CE1, CE2, CE3, and CE4, respectively, of clock signal 110.

Figure 3:
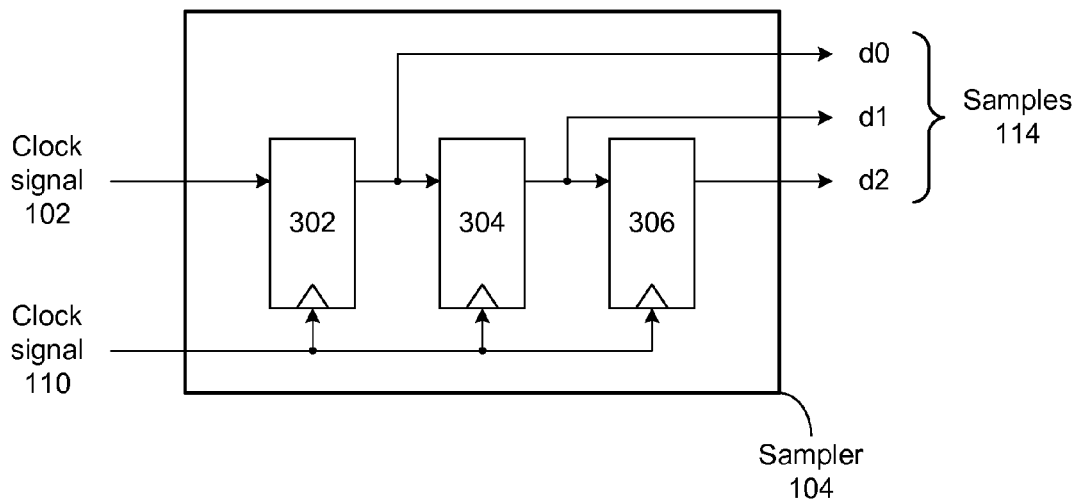
FIG. 3 illustrates an implementation of sampler 104 in accordance with some embodiments described herein.

FIG. 3 illustrates an implementation of sampler 104 in accordance with some embodiments described herein. Sampler 104 can include multiple high-frequency flip-flops, e.g., flip-flops 302-306. The flip-flops can be configured in a chain, e.g., clock signal 102 is provided as an input to flip-flop 302, the output of flip-flop 302 is provided as an input to flip-flop 304, and the output of flip-flop 304 is provided as an input to flip-flop 306. The number of flip-flops that are used in sampler 104 can depend on the number of samples that frequency change detection logic 108 requires to detect a change in the frequency of clock signal 102. Each of the flip-flops is clocked by clock signal 110, and the outputs of the flip-flops can correspond to samples 114 that can be provided as inputs to frequency change detection logic 108. As shown in FIG. 3, the outputs of flip-flops 302, 304, and 306 are labeled d0, d1, and d2, respectively.

Figure 4A:
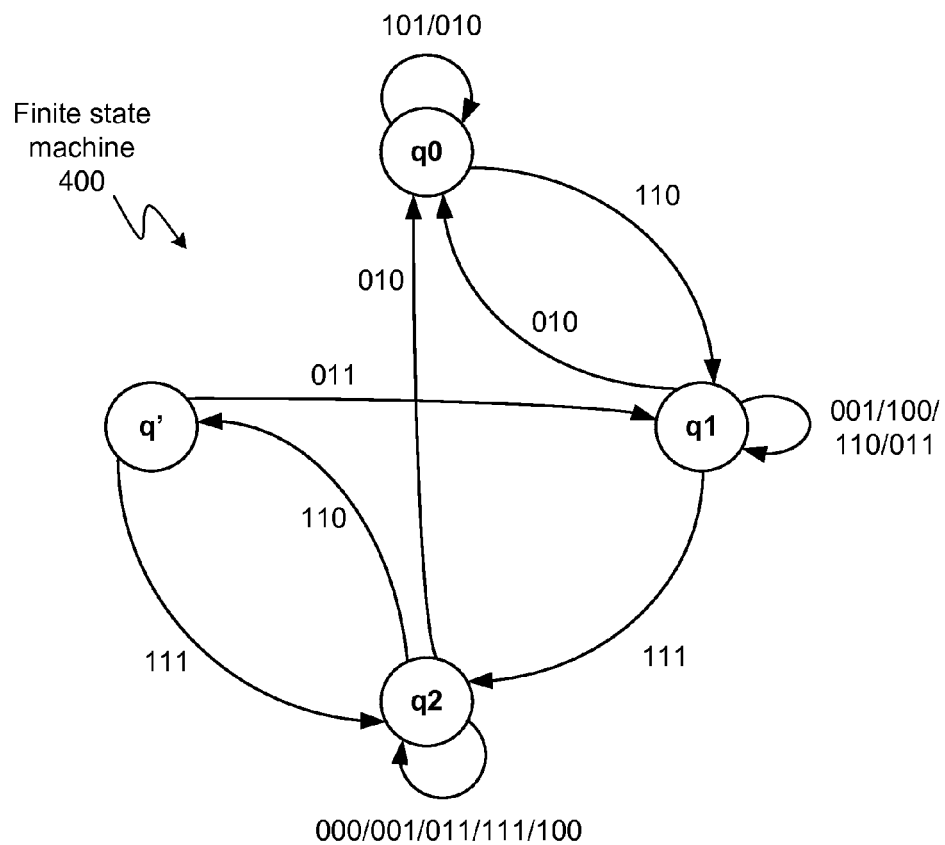
FIG. 4A illustrates a finite state machine representation of an implementation of frequency change detection logic 108 in accordance with some embodiments described herein.

FIG. 4A illustrates a finite state machine representation of an implementation of frequency change detection logic 108 in accordance with some embodiments described herein. Finite state machine (FSM) 400 has four states: q0, q1, q2, and q'. The state transitions are triggered by samples 114, i.e., by the values of d0, d1, and d2 (see FIG. 3). For example, the transition from state q1 to state q2 is triggered when d2=1, d1=1, and d0=1. This is depicted in FIG. 4A by the pattern "111" that is shown next to the arrow from state q1 to state q2. The leftmost symbol in pattern "111" corresponds to d2, the middle symbol corresponds to d1, and the rightmost symbol corresponds to d0. If a state transition is triggered by multiple sets of values for d0, d1, and d2, then the patterns that correspond to those sets of values are separated by the "/" symbol. For example, the self loop for state q0 is triggered when either (a) d2=1, d1=0, and d0=1, or (2) d2=0, d1=1, and d0=0. This is depicted in FIG. 4A by the pattern "101/010."

Each state q0, q1, and q2 corresponds to a particular harmonic of clock signal 102. State q' corresponds to the same harmonic as state q2. A frequency change is detected when FSM 400 transitions from one state to another state. Specifically, state transitions q0→q1 and q1→q2 correspond to the frequency of clock signal 102 being halved, state transitions q'→q1 and q1→q0 correspond to the frequency of clock signal 102 being doubled, and state transition q2→q0 corresponds to the frequency of clock signal 102 being quadrupled. The state transitions between states q' and q2 do not correspond to a change in the frequency of clock signal 102.

Figure 4B:
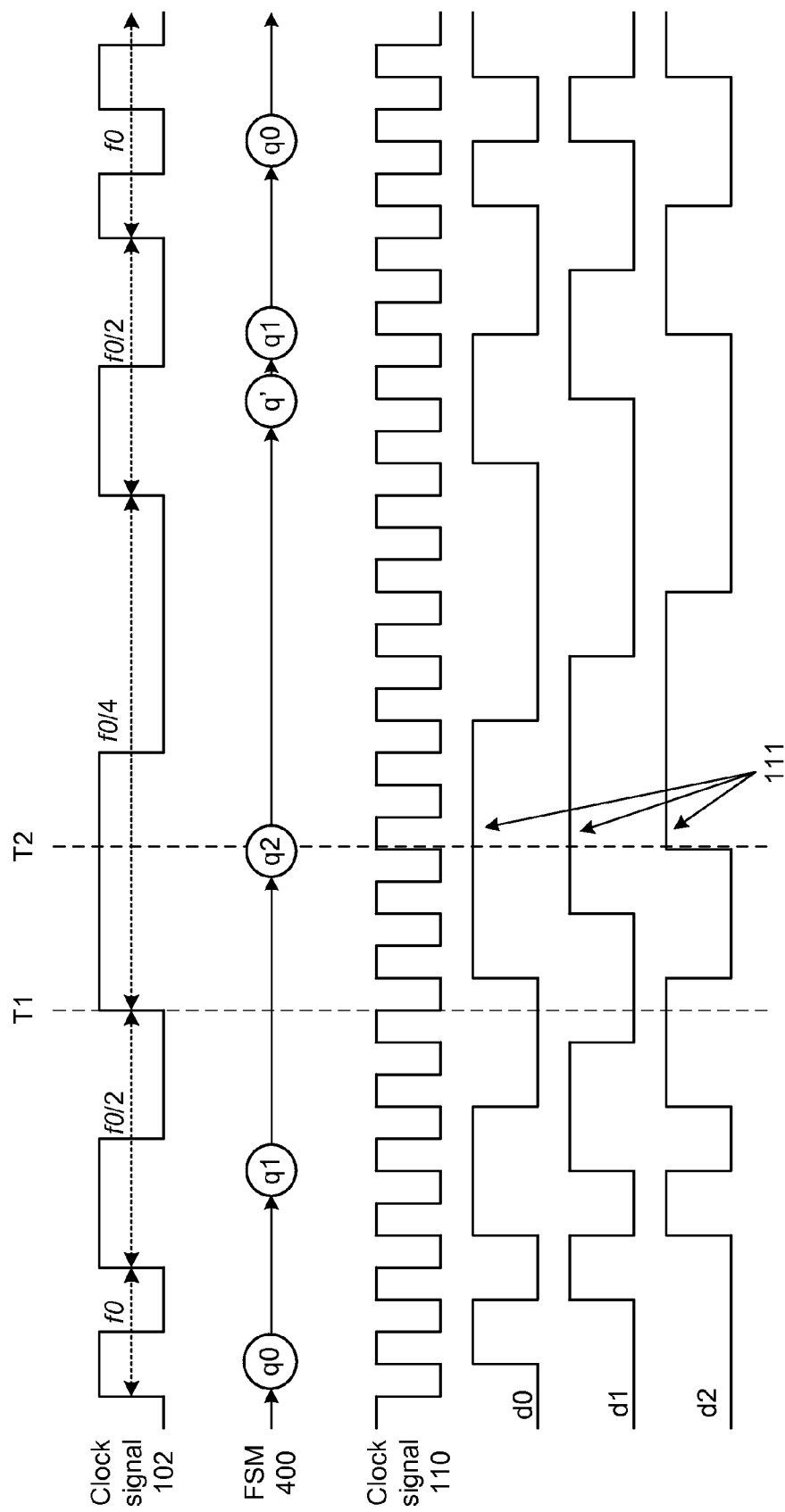
FIG. 4B illustrates waveforms that correspond to FSM 400 in accordance with some embodiments described herein.

FIG. 4B illustrates waveforms that correspond to FSM 400 in accordance with some embodiments described herein. As shown in FIG. 4B, clock signal 102 changes its frequency four times: from f0 to f0/2, from f0/2 to f0/4, from f0/4 to f0/2, and from f0/2 to f0. Note that clock signal 110 continues to oscillate at 2×f0 through all of these frequency changes in clock signal 102. Sampler 104 samples clock signal 102 using clock signal 110 to generate values for d0, d1, and d2, whose waveforms are also shown in FIG. 4B. FSM 400 transitions through different states depending on the values of d0, d1, and d2. For example, consider the state of FSM 400 at times T1 and T2. At time T1, FSM 400 is in state q1, and the frequency of clock signal 102 changes from f0/2 to f0/4. At time T2, the values of d0, d1, and d2 are all equal to 1. This triggers a state change in FSM 400 from q1 to q2, and as a result of this transition, the change in the frequency of clock signal 102 (which occurred at time T1) is detected at time T2. Note that the values of d0, d1, and d2 change between times T1 and T2, but these sets of values do not trigger a state change.

The rationale for triggering a transition from state q1 to q2 when d0=1, d1=1, and d2=1 is as follows. If the frequency of clock signal 102 was equal to f0/2 at time T2, then a clock edge would have occurred just before time T2, and the value of d0 at time T2 would have been 0. However, if that does not happen (i.e., if d0=1, d1=1, and d2=1 at time T2), then it implies that the frequency of clock signal 102 may have halved. Other transitions in FSM 400 can likewise be determined using similar rationales.

Note that frequency to digital conversion can be accomplished by sampling the unknown frequency signal with a known frequency signal. The frequency of MILO 208 is substantially constant since MILO 208 outputs a clock signal that is close to the natural oscillation frequency of MILO 208, while the reference clock signal frequency can change. A frequency to digital converter (e.g., circuit 100 shown in FIG. 1) can oversample the reference clock signal with the high frequency MILO clock output. A finite state machine (e.g., FSM 400) can determine the sub-harmonic reference frequency based on the current FSM state and the sampled pattern. In general, if M is the number of frequency doublings in the system, then the frequency to digital converter requires M+1 clock cycles of the fast clock signal (e.g., output of MILO 208) with an oversampling ratio of 2 to resolve the detection. For example, in the example shown in FIG. 4A, with M=2, a "101" or "010" pattern indicates an 800 MHz reference, and a "111" or "000" pattern indicates a 200 MHz reference.

The frequency to digital converter implementation described in reference to FIGS. 1, 2A-2B, 3, and 4A-4B is for illustration purposes only, and is not intended to limit the scope of the embodiments disclosed herein. After reviewing this disclosure, other implementations of frequency to digital converters will be apparent to a person having ordinary skill in the art.

Frequency change detection logic 108 can generate clock frequency change information 112 based on detecting a change in the frequency of clock signal 102. Specifically, clock frequency change information 112 can be a value that indicates whether or not the frequency of clock signal 102 changed and the multiplication factor by which the frequency changed (e.g., doubled, tripled, quadrupled, halved, etc.). Clock frequency change information 112 can be used in many applications. Some of these applications are now discussed.

In high performance mobile systems throughput and memory bandwidth demand varies rapidly in response to different application usage. It is desirable to run mobile systems at the lowest frequency possible while delivering adequate performance in order to achieve the lowest possible power consumption. Such rapid processor workload variation translates to a sudden change in reference clocks to the controller which requires controller-memory bandwidth to scale according to demand. It is therefore desirable to allow the memory interface data rate to scale with the processor workload by being slaved to a processor clock which serves as a reference clock for the interface. Ultimately, it is desirable to allow the reference clock to shift on-the-fly without interrupting traffic.

Figure 5A:
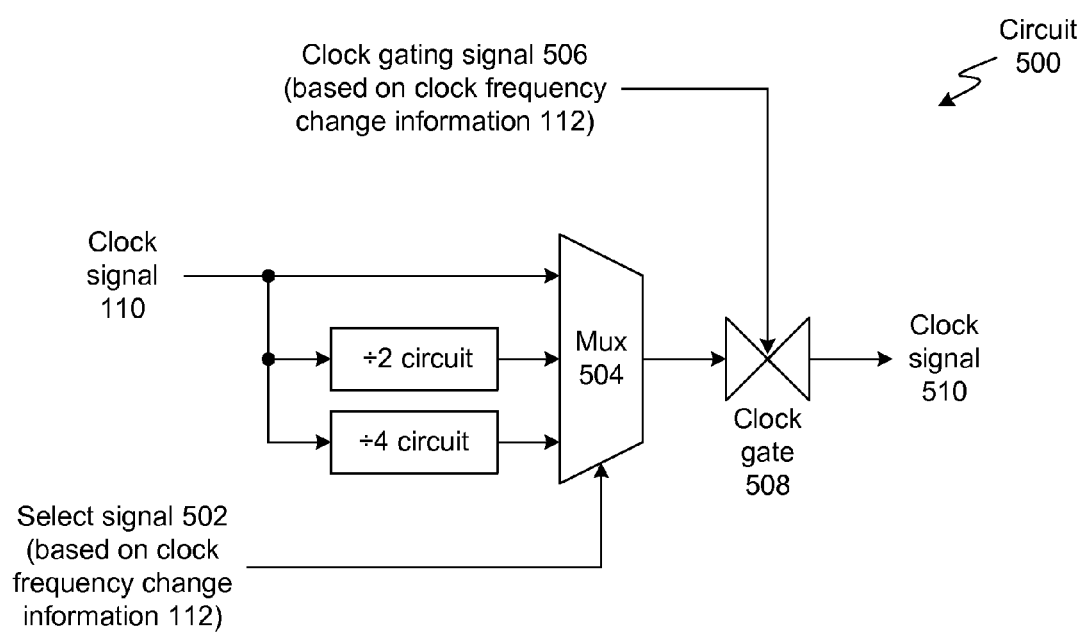
FIG. 5A illustrates how clock frequency change information 112 can be used in a frequency agile clock multiplier unit in accordance with some embodiments described herein.

FIG. 5A illustrates how clock frequency change information 112 can be used in a frequency agile clock multiplier unit in accordance with some embodiments described herein. Clock signal 102 (see FIG. 1) can be a reference clock signal (e.g., a 200 MHz clock signal) that needs to be multiplied up so that the clock signal can be used in a high performance memory system. As explained above, clock signal 110 can be derived from clock signal 102, and the frequency of clock signal 110 can be substantially constant (e.g., the frequency of clock signal 110 may be close to the natural oscillation frequency of MILO 208 shown in FIG. 2A). Circuit 500 can be used to maintain a fixed multiplication ratio between the frequency of clock signal 102 and the frequency of clock signal 510 by selecting an appropriate frequency divider circuit using clock frequency change information 112. Clock signal 510 may be used for communicating between a memory controller and one or more memory devices.

For example, clock signal 110 can be inputted into a "÷2 circuit" and a "÷4 circuit." The term "÷n circuit" refers to a frequency divider circuit that outputs a clock signal whose frequency is 1/n times the frequency of the input clock signal. Clock signal 110 and the outputs of the ÷2 and ÷4 circuits can be provided as inputs to multiplexer 504. Multiplexer 504 can receive select signal 502 that is based on clock frequency change information 112. Specifically, select signal 502 enables multiplexer 504 to select the appropriate frequency divider circuit in order to maintain a constant multiplication ratio between clock signal 102 and clock signal 510. As an illustrative example, suppose the initial frequency of clock signal 102 is equal to 200 MHz, the frequency of clock signal 110 is equal to 3.2 GHz, and a clock multiplication ratio of 16 is desired to be maintained between clock signal 102 and clock signal 510. In this example, when the frequency of clock signal 102 is equal to 200 MHz, select signal 502 causes multiplexer 504 to output clock signal 110. When the frequency of clock signal 102 halves to 100 MHz, frequency change detection logic 108 (see FIG. 1) detects the change in the frequency of clock signal 102, and generates corresponding clock frequency change information 112. Note that clock signal 110 continues to oscillate at 3.2 GHz even after the frequency of clock signal 102 changes to 100 MHz. Clock frequency change information 112 can then be used to generate select signal 502 so that multiplexer 504 selects the output of the ÷2 circuit, thereby changing the frequency of clock signal 510 to 1.6 GHz, and in doing so, maintaining the desired 16× multiplication ratio between clock signal 102 and clock signal 510.

In some embodiments, the output of multiplexer 504 can be directly outputted as clock signal 510. In other embodiments, the output of multiplexer 504 is passed through clock gate 508, and then outputted as clock signal 510. Clock gate 508 is controlled by clock gating signal 506 which is based on clock frequency change information 112. Clock gate 508 can be used to maintain a constant serialization ratio when the frequency of clock signal 102 changes (e.g., by ensuring that the same number of bits are transmitted during one clock cycle of the reference clock).

Figure 5B:
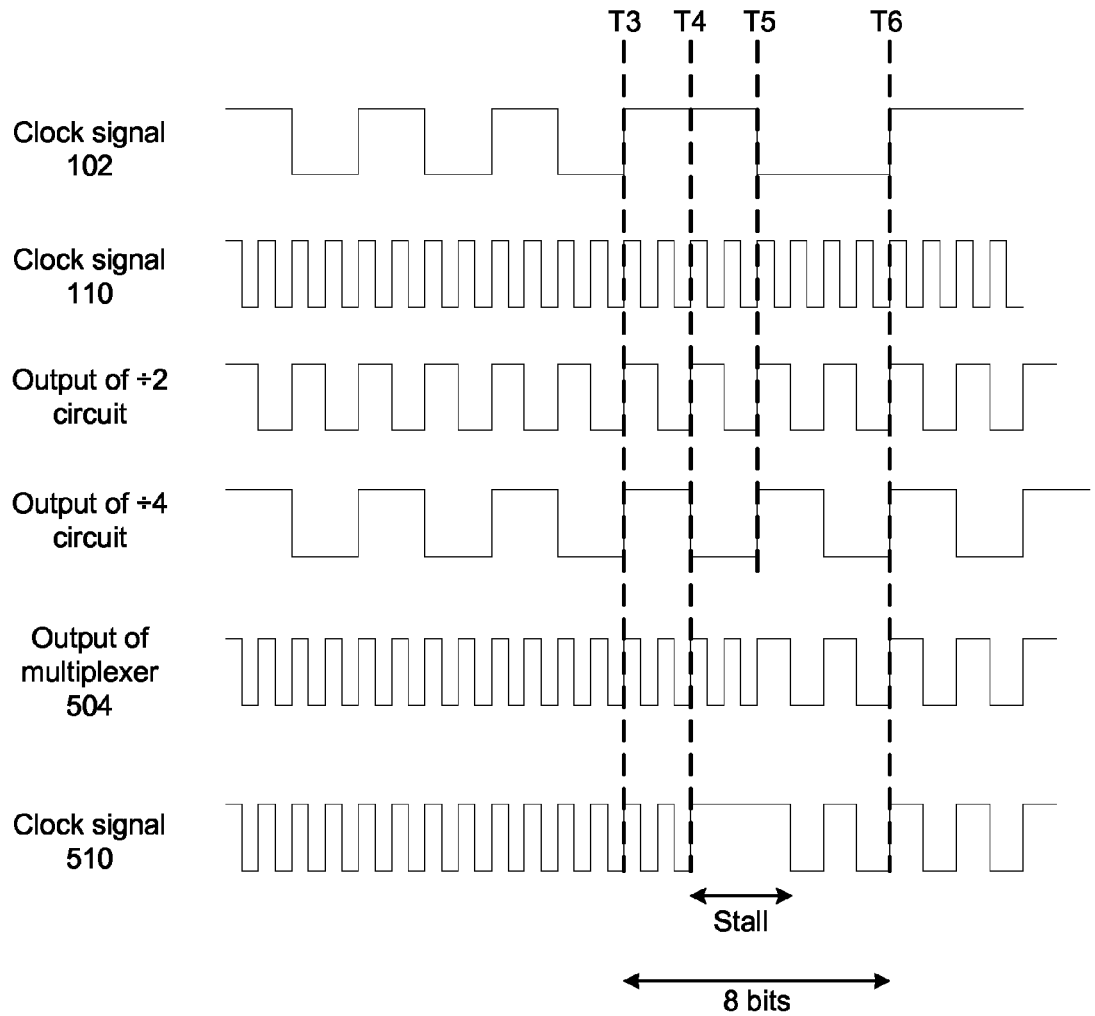
FIG. 5B illustrates how clock gate 508 can be used to stall the output clock signal when the reference clock signal changes to a sub-harmonic frequency in accordance with some embodiments described herein.

FIG. 5B illustrates how clock gate 508 can be used to stall the output clock signal when the reference clock signal changes to a sub-harmonic frequency in accordance with some embodiments described herein. At time T3, the frequency of clock signal 102 halves, and at time T4, a change in the frequency of clock signal 102 is detected. At time T5, it is determined that the frequency of clock signal 102 was halved, and the frequency of the output of multiplexer 504 is also correspondingly halved (e.g., by providing the appropriate select signal 502 to multiplexer 504 based on the clock frequency change information 112). Note that, between times T3 and T4, the data bits (which are clocked according to clock signal 510) are sent at the original frequency. Therefore, to maintain a constant clock serialization ratio (e.g., 8 bits per clock cycle of clock signal 102), clock signal 510 is stalled using clock gate 608 as shown in FIG. 5B.

Figure 5C:
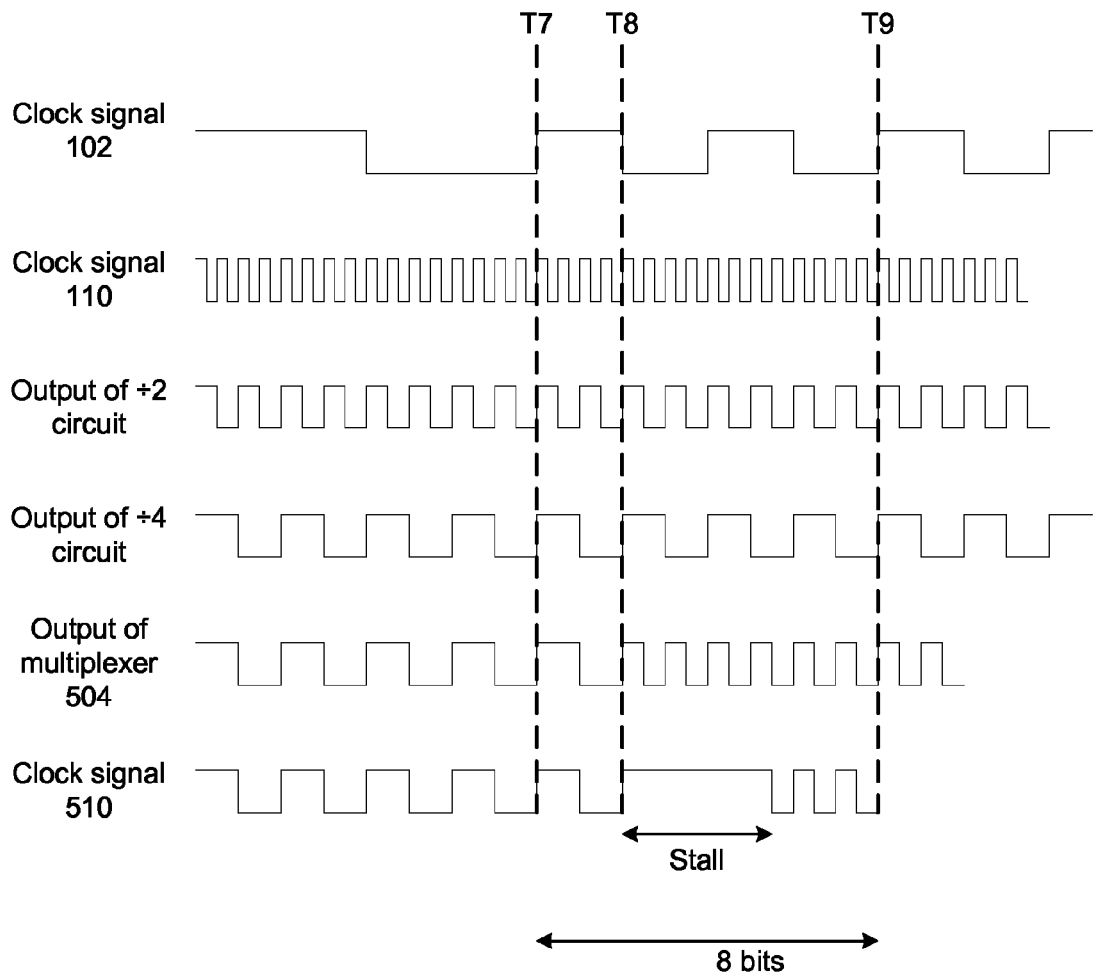
FIG. 5C illustrates how clock gate 508 can be used to stall the output clock signal when the reference clock signal changes to a super-harmonic frequency in accordance with some embodiments described herein.

FIG. 5C illustrates how clock gate 508 can be used to stall the output clock signal when the reference clock signal changes to a super-harmonic frequency in accordance with some embodiments described herein. At time T7, the frequency of clock 102 doubles, and at time T8, the change in the frequency of clock 102 is detected and the frequency of the output of multiplexer 504 is correspondingly doubled (e.g., by providing the appropriate select signal 502 to multiplexer 504 based on the clock frequency change information 112). Note that, between times T7 and T8, the data bits (which are clocked according to clock signal 510) are sent at the original frequency. Clock signal 510 can be stalled using clock gate 508 for an extra clock cycle as shown in FIG. 5C so that 8 bits are sent over two clock cycles of clock signal 102.

Figure 6:
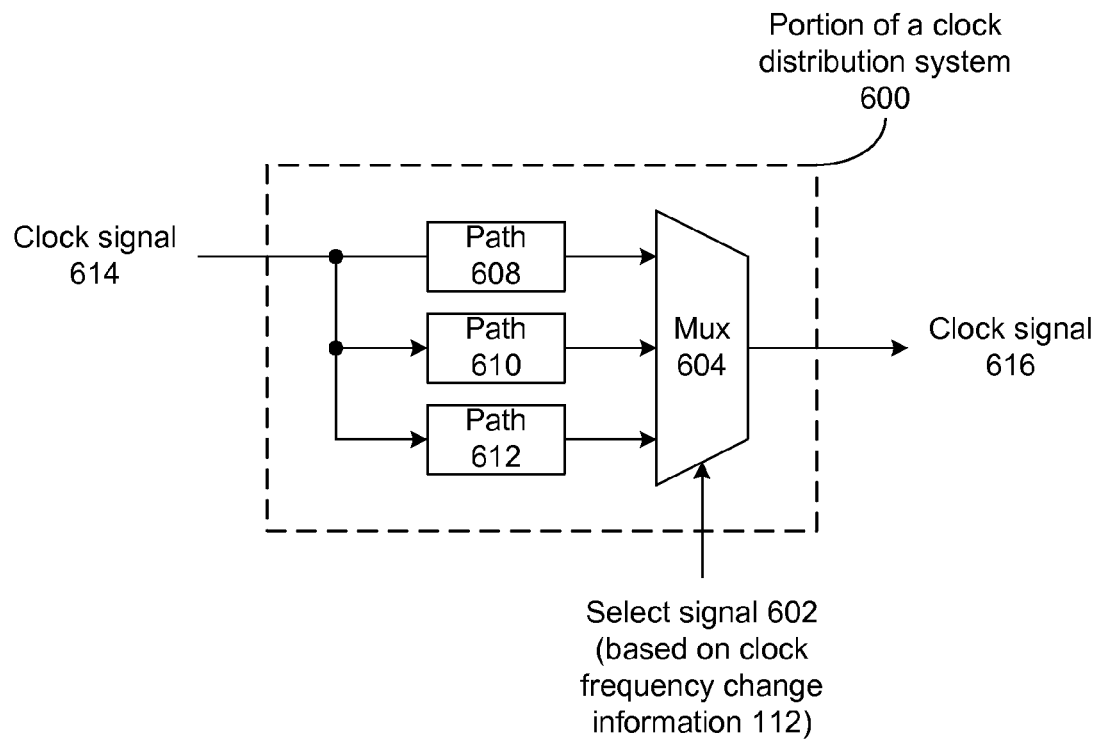
FIG. 6 illustrates how clock frequency change information 112 can be used to reduce the power consumption of a clock distribution system in accordance with some embodiments described herein.

FIG. 6 illustrates how clock frequency change information 112 can be used to reduce the power consumption of a clock distribution system in accordance with some embodiments described herein. A clock distribution system is typically optimized for a given clock frequency, and in frequency agile systems the clock distribution system is typically optimized for the highest clock frequency. Therefore, in frequency agile systems, the clock distribution system may consume more power than necessary at lower clock frequencies.

Some embodiments described herein can use clock frequency change information 112 to route a clock signal via different paths in the clock distribution system, wherein the different paths are optimized for different clock frequencies. For example, in FIG. 6, portion of a clock distribution system 600 can receive clock signal 614 and output clock signal 616. Within the portion of the clock distribution system 600, the clock signal can be routed through paths 608-612, and the outputs from these paths can be provided as inputs to multiplexer 604. Select signal 602 can be provided to multiplexer 604 to select which path from paths 608-612 is used for routing clock signal 614. Specifically, paths 608-612 may be optimized to operate at different clock frequencies, and the appropriate path in portion of the clock distribution system 600 may be selected based on frequency change information 112.

Figure 7:
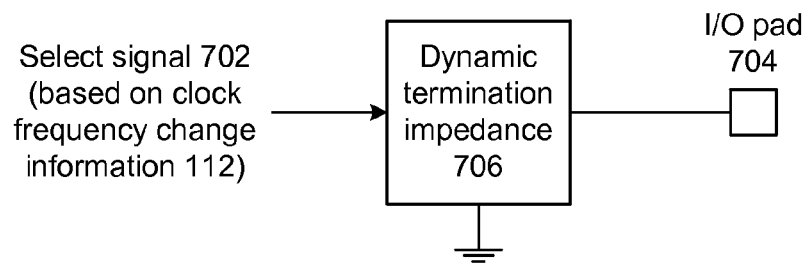
FIG. 7 illustrates how frequency change information 112 can be used to dynamically change the termination impedance in accordance with some embodiments described herein.

FIG. 7 illustrates how frequency change information 112 can be used to dynamically change the termination impedance in accordance with some embodiments described herein. I/O pad 704 may be coupled to a signal line (e.g., a wire that carries a data signal). The data signal integrity of the data signal that is communicated over the signal line and the power consumption of the I/O driver circuitry that drives the signal line can depend on the termination impedance of I/O pad 704. In frequency agile systems, the data signal integrity can be improved and/or the power consumption can be reduced by dynamically changing the termination impedance of the I/O pad. Dynamic termination impedance 706 can provide different termination impedances depending on select signal 702. Some embodiments described herein can generate select signal 702 based on frequency change information 112, and then use select signal 702 to change the impedance of dynamic termination impedance 706, thereby improving the signal integrity and/or reducing the power consumption of the memory system.

Figure 8:
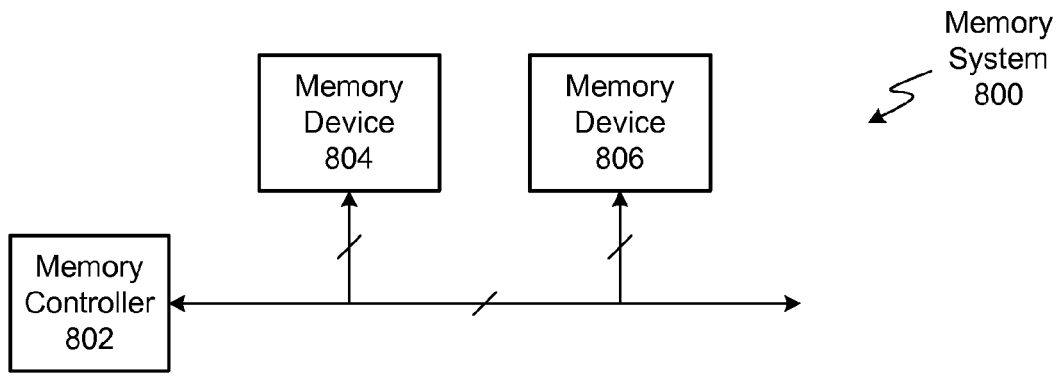
FIG. 8 illustrates a memory system in accordance with some embodiments described herein.

FIG. 8 illustrates a memory system in accordance with some embodiments described herein. A memory system can include a memory controller coupled to one or more memory devices via signal lines. For example, memory system 800 includes memory controller 802 coupled to memory devices 804 and 806 via signal lines. In some embodiments described herein, memory controller 802 provides one or more clock signals and one or more command/control signals to memory devices 804 and 806. Memory devices 804 and 806 provide one or more data signals to memory controller 802.

Examples of memory devices include dynamic random access memory (DRAM) devices such as synchronous double data rate (DDR) DRAM or non-volatile memory such as Flash memory. In some embodiments, memory controller 802 is an integrated circuit device having an interface that orchestrates data flow to and from a memory device. In various embodiments, memory controller 802 is disposed, along with one or more memory devices, on a circuit board, or may reside with the memory device in a common encapsulated package, or included in a stack configuration with the memory device (for example, in a package on package (PoP) configuration or using through silicon via (TSV) technology).

The embodiments presented in this disclosure can be used in memory system 800. Specifically, memory controller 802 may receive a reference clock signal 102, and may use the circuitry shown in FIG. 1 to detect a change in the frequency of reference clock signal 102. The clock frequency change information 112 may then be used in memory system 800 for one or more purposes. For example, memory controller 802 may use circuitry shown in FIG. 5A to generate clock signal 510, and use clock signal 510 for communications between memory controller 802 and memory devices 804 and 806. The circuitry shown in FIG. 6 may be used to reduce the power consumption of the clock distribution system in memory system 800. The circuitry shown in FIG. 7 may be used to dynamically change the termination impedance in memory system 800.

Figure 9:
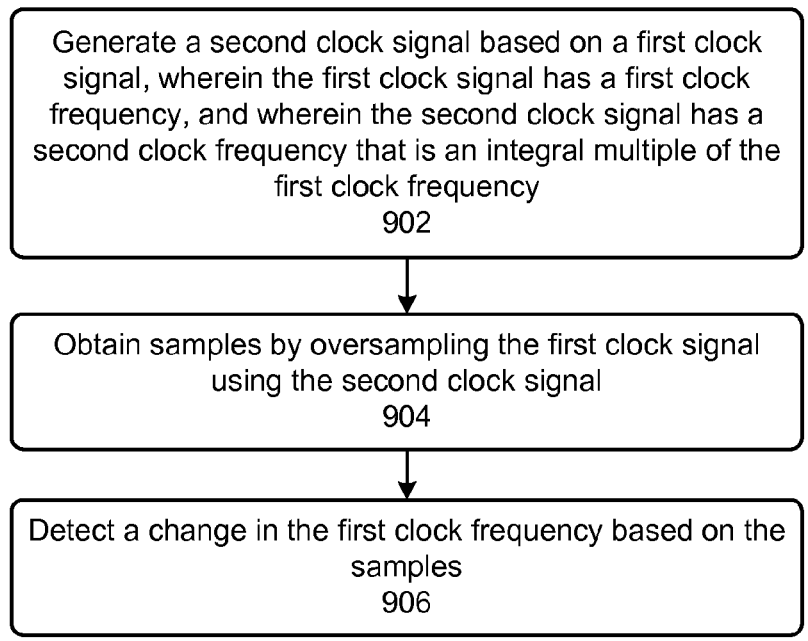
FIG. 9 presents a flowchart that illustrates a process for detecting a change in a clock frequency in accordance with some embodiments described herein.

FIG. 9 presents a flowchart that illustrates a process for detecting a change in a clock frequency in accordance with some embodiments described herein. The process can begin by generating a second clock signal based on a first clock signal, wherein the first clock signal has a first clock frequency, and wherein the second clock signal has a second clock frequency that is an integral multiple of the first clock frequency (operation 902). The frequency of the second clock signal may remain substantially constant even when the frequency of the first clock signal changes to a sub- or super-harmonic frequency. Next, the process can obtain samples by oversampling the first clock signal using the second clock signal (operation 904). The process can then detect a change in the first clock frequency based on the samples (operation 906).

In some embodiments, the process can further comprise generating a third clock signal based on the second clock signal, wherein the third clock signal has a third clock frequency, and wherein the ratio between the third clock frequency and the second clock frequency is equal to a frequency division ratio that is selected based on the detected change in the first clock frequency. In some embodiments, the process can further comprise stalling the third clock signal based on the detected change in the first clock frequency. In some embodiments, the process can further comprise routing the second clock signal through a clock distribution system that is selected from a plurality of clock distribution systems based on the detected change in the first clock frequency. In some embodiments, the process can further comprise changing a termination impedance based on the detected change in the first clock frequency.

The methods and/or processes that have been implicitly or explicitly described in this disclosure can be embodied in hardware, software, or a combination thereof. Hardware embodiments include, but are not limited to, IC chips, field-programmable gate arrays (FPGAs), system-on-chips (SoCs), application specific integrated circuits (ASICs), etc.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit (IC), comprising:
 a multiplying injection-locked oscillator (MILO), wherein the MILO generates a second clock signal based on a first clock signal, wherein the first clock signal has a first clock frequency, and wherein the second clock signal has a second clock frequency that is an integral multiple of the first clock frequency;
 a sampler coupled to the MILO, wherein the sampler obtains samples by oversampling the first clock signal using the second clock signal; and
 a finite state machine (FSM) circuit coupled to the sampler, wherein state transitions in the FSM are triggered based on the samples, and wherein a change in the first clock frequency is detected when a corresponding state transition is triggered in the FSM circuit.

2. The IC of claim 1, further comprising:
a set of frequency divider circuits coupled to the MILO, wherein each frequency divider circuit receives the second clock signal, and wherein each frequency divider circuit has a different frequency division ratio; and
a multiplexer coupled to the set of frequency divider circuits, wherein the multiplexer selects an output of one of the frequency divider circuits in the set of frequency divider circuits based on the detected change in the first clock frequency.

3. The IC of claim 2, further comprising a clock gate coupled to an output of the multiplexer, wherein the clock gate stalls an output signal of the multiplexer based on the detected change in the first clock frequency.

4. The IC of claim 1, further comprising:
a set of clock distribution paths in a clock distribution system; and
a multiplexer coupled to the set of clock distribution paths, wherein the multiplexer selects an output of one of the clock distribution paths in the set of clock distribution paths based on the detected change in the first clock frequency.

5. The IC of claim 1, further comprising:
a driver circuit that drives a signal on a signal line; and
a dynamic termination impedance circuit coupled to the signal line, wherein the dynamic termination impedance circuit changes a termination impedance based on the detected change in the first clock frequency.

6. A system comprising:
one or more memory devices; and
a memory controller coupled to the one or more memory devices, wherein the memory controller orchestrates data flow to and from the one or more memory devices, and wherein the memory controller comprises:
  a multiplying injection-locked oscillator (MILO), wherein the MILO generates a second clock signal based on a first clock signal, wherein the first clock signal has a first clock frequency, and wherein the second clock signal has a second clock frequency that is an integral multiple of the first clock frequency;
  a sampler coupled to the MILO, wherein the sampler obtains samples by oversampling the first clock signal using the second clock signal; and
  a finite state machine (FSM) circuit coupled to the sampler, wherein state transitions in the FSM are triggered based on the samples, and wherein a change in the first clock frequency is detected when a corresponding state transition is triggered in the FSM circuit.

7. The system of claim 6, wherein the memory controller further comprises:
a set of frequency divider circuits coupled to the MILO, wherein each frequency divider circuit receives the second clock signal, and wherein each frequency divider circuit has a different frequency division ratio; and
a multiplexer coupled to the set of frequency divider circuits, wherein the multiplexer selects an output of one of the frequency divider circuits in the set of frequency divider circuits based on the detected change in the first clock frequency.

8. The system of claim 7, wherein the memory controller further comprises a clock gate coupled to an output of the multiplexer, wherein the clock gate stalls an output signal of the multiplexer based on the detected change in the first clock frequency.

9. The system of claim 6, further comprising:
a set of clock distribution paths in a clock distribution system; and
a multiplexer coupled to the set of clock distribution paths, wherein the multiplexer selects an output of one of the clock distribution paths in the set of clock distribution paths based on the detected change in the first clock frequency.

10. The system of claim 6, further comprising:
a driver circuit that drives a signal on a signal line; and
a dynamic termination impedance circuit coupled to the signal line, wherein the dynamic termination impedance circuit changes a termination impedance based on the detected change in the first clock frequency.

11. A method, comprising:
generating a second clock signal based on a first clock signal, wherein the first clock signal has a first clock frequency, and wherein the second clock signal has a second clock frequency that is an integral multiple of the first clock frequency;
oversampling the first clock signal using the second clock signal to obtain a sequence of samples;
executing a finite state machine (FSM) based on the sequence of samples; and
detecting a change in the first clock frequency when a corresponding state transition is triggered in the FSM.

12. The method of claim 11, further comprising generating a third clock signal based on the second clock signal, wherein the third clock signal has a third clock frequency, and wherein a ratio between the third clock frequency and the second clock frequency is equal to a frequency division ratio that is selected based on the detected change in the first clock frequency.

13. The method of claim 12, further comprising stalling the third clock signal based on the detected change in the first clock frequency.

14. The method of claim 11, further comprising routing the second clock signal through a clock distribution path that is selected from a plurality of clock distribution paths based on the detected change in the first clock frequency.

15. The method of claim 11, further comprising changing a termination impedance of a signal line based on the detected change in the first clock frequency.

\* \* \* \* \*